United States Patent
Nebel et al.

(10) Patent No.: US 9,988,737 B2
(45) Date of Patent: Jun. 5, 2018

(54) EPITAXIAL DIAMOND LAYER AND METHOD FOR THE PRODUCTION THEREOF

(71) Applicant: Fraunhofer-Gesellschaft zur Förderung der angewandten Forschung e.V., München (DE)

(72) Inventors: Christoph E Nebel, Freiburg (DE); Claudia Widmann, Müllheim (DE)

(73) Assignee: FRAUNHOFER-GESELLSCHAFT ZUR FÖRDERUNG DER ANGEWANDTEN FORSCHUNG E.V., Munich (DE)

( * ) Notice: Subject to any disclaimer, the term of this patent is extended or adjusted under 35 U.S.C. 154(b) by 176 days.

(21) Appl. No.: 14/996,835

(22) Filed: Jan. 15, 2016

(65) Prior Publication Data
US 2016/0208413 A1 Jul. 21, 2016

(30) Foreign Application Priority Data

Jan. 19, 2015 (DE) .................. 10 2015 200 692

(51) Int. Cl.
C30B 25/18 (2006.01)
C30B 29/04 (2006.01)
C30B 29/10 (2006.01)

(52) U.S. Cl.
CPC ............ *C30B 25/183* (2013.01); *C30B 29/04* (2013.01)

(58) Field of Classification Search
None
See application file for complete search history.

(56) References Cited

U.S. PATENT DOCUMENTS

| 5,006,914 | A | * | 4/1991 | Beetz, Jr. ................ C30B 25/02 257/14 |
| 5,314,652 | A | | 5/1994 | Simpson et al. |
| 5,707,717 | A | | 1/1998 | Shibahara et al. |

(Continued)

FOREIGN PATENT DOCUMENTS

| DE | 196 49 409 A1 | 10/1997 |
| DE | 693 33 176 T2 | 4/2004 |

(Continued)

OTHER PUBLICATIONS

X. Jiang et al., "Coalescence and overgrowth of diamond grains for improved heteroepitaxy on silicon (001)", dated Mar. 1, 1998, pp. 2511-2518, Journal of Applied Physics, vol. 83, No. 5, AIP Publishing.

(Continued)

*Primary Examiner* — John J Figueroa
(74) *Attorney, Agent, or Firm* — Brinks Gilson & Lione

(57) ABSTRACT

An epitaxial diamond layer and a method for the production thereof can be provided that comprises the following steps: providing a substrate; depositing a metal layer on at least a subarea of the substrate, wherein the metal layer contains, or consists of, at least one period 4, 5 or 6 metal having a melting point of greater than or equal to 1200 K; and depositing a diamond layer on at least a subarea of the metal layer; wherein at least one intermediate layer is deposited between the metal layer and the diamond layer and has a higher lattice constant than undoped crystalline diamond and a lower hardness than undoped crystalline diamond.

12 Claims, 2 Drawing Sheets

(56) References Cited

U.S. PATENT DOCUMENTS

| | | | |
|---|---|---|---|
| 5,785,871 A | 6/1998 | Noh | |
| 6,582,513 B1 * | 6/2003 | Linares | C30B 25/02 117/102 |
| 6,872,988 B1 | 3/2005 | Goyal | |
| 7,060,130 B2 | 6/2006 | Golding et al. | |
| 2004/0069209 A1 | 4/2004 | Golding et al. | |
| 2005/0202665 A1 * | 9/2005 | Namba | C30B 25/02 438/607 |
| 2006/0261349 A1 * | 11/2006 | Doering | C02F 1/46109 257/77 |
| 2011/0315074 A1 | 12/2011 | Noguchi et al. | |
| 2014/0137795 A1 * | 5/2014 | Chang | C30B 29/04 117/95 |

FOREIGN PATENT DOCUMENTS

| | | |
|---|---|---|
| DE | 196 49 409 B4 | 10/2005 |
| EP | 0 783 596 B1 | 4/2000 |
| WO | WO 2005/047574 A2 | 5/2005 |

OTHER PUBLICATIONS

Katsuki Kusakabe et al., "Electrical properties of boron-doped diamond films synthesized by MPCVD on an iridium substrate", dated Aug. 2003, pp. 1396-1401, Diamond and Related Materials, vol. 12, Issue 8, Elsevier Science.

M. Bernard et al., "About the origin of the low wave number structures of the Raman spectra of heavily boron doped diamond films", dated 2004, pp. 896-899, Diamond and Related Materials, vol. 13, Issues 4-8, Elsevier Science.

T. Wojewoda et al. "Doping-induced anisotropic lattice strain in homoepitaxial heavily boron-doped diamond", dated Jan. 30, 2008, pp. 1302-1306, Diamond and Related Materials, vol. 17, Elsevier Science.

André F. Sartori et al., "In situ boron doping during heteroepitaxial growth of diamond on Ir/YSZ/Si", dated Aug. 13, 2012, pp. 1643-1650, Physica Status Solidi A, vol. 209, No. 9.

* cited by examiner

EPITAXIAL DIAMOND LAYER AND METHOD FOR THE PRODUCTION THEREOF

CROSS-REFERENCE TO RELATED APPLICATIONS

This application claims priority under 35 USC § 119 to German Patent Application No. 10 2015 200 692.1, Jan. 19, 2015, the entire contents of which are hereby incorporated herein by reference.

TECHNICAL FIELD

The invention relates to a method for producing epitaxial diamond layers.

BACKGROUND

US2004/0069209 A1 discloses such a method and such a diamond layer. In this known method, a metal oxide substrate is provided with an iridium layer. Diamond from the gas phase is deposited in a CVD process on the surface of the iridium layer.

However, a drawback of this known method is the lattice mismatch between diamond and iridium of about 7.1%. This merely serves for producing a nanocrystalline diamond layer having many defects. Therefore, such diamond layers cannot be used as a starting material for electronic components.

BRIEF DESCRIPTION OF THE DRAWINGS

The embodiments may be better understood with reference to the following drawings and description. The components in the figures are not necessarily to scale. Moreover, in the figures, like-referenced numerals designate corresponding parts throughout the different views.

DETAILED DESCRIPTION

Figure 1:
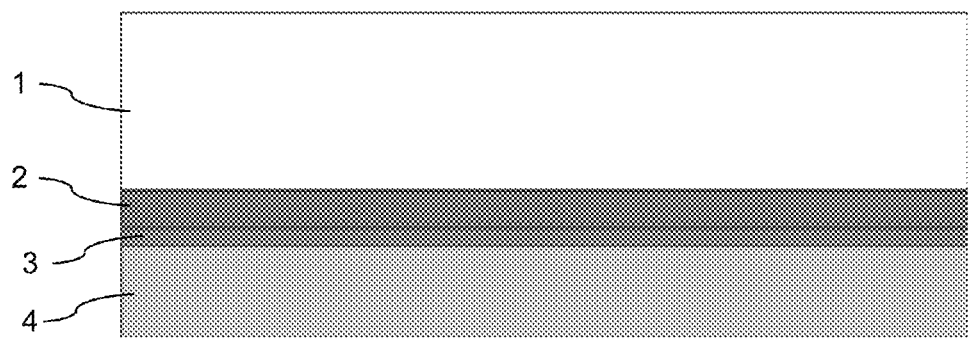
FIG. 1 shows a cross-section through a diamond layer on a substrate.

A method can be provided by which a diamond layer of higher quality can be produced than by the known method from the prior art. One such method can comprise the following steps: providing a substrate; depositing a metal layer on at least a subarea of the substrate, wherein the metal layer contains, or consists of, at least one fourth, fifth or sixth period metal having a melting point of greater than or equal to 1200 K; and depositing a diamond layer on at least a subarea of the metal layer. The invention also relates to a diamond layer on a substrate, wherein a metal layer is present on at least a subarea of the substrate and contains, or consists of, a fourth, fifth or sixth period metal having a melting point of greater than or equal to 1200 K.

The invention provides an epitaxial diamond layer and a method for the production thereof, in which the diamond is produced from a gas phase. For example, the gas phase can contain hydrogen admixed with a hydrocarbon in a concentration of about 1% to about 5%. In some embodiments of the invention, the hydrocarbon can be selected from methane, ethane and/or acetylene. In addition, the gas phase can contain dopants, e.g. boron or nitrogen. In order to deposit the diamond layer, the gas phase is activated, e.g. by a heated filament wire or by coupling microwave output.

According to the invention, the epitaxial diamond layer is produced on a substrate. The substrate can contain, or consist of, diamond, and therefore a homoepitaxial diamond layer can be produced from the gas phase. In other embodiments of the invention, the substrate can contain another material. As a result, the diamond is deposited in heteroepitaxial fashion on the substrate.

In some embodiments of the invention, a metal layer is arranged between substrate and epitaxial diamond layer and covers at least a subarea of the substrate. The metal layer contains at least one fourth, fifth or sixth period metal having a melting point of greater than or equal to 1200 K. In addition, the metal layer can contain further alloying constituents or unavoidable contaminations. In some embodiments of the invention, a pure elemental phase of a metal can also be arranged on the substrate as a metal layer. The employed metal or the employed alloy has a melting point of more than 1200 K, and therefore the metal layer does not evaporate or liquefy when the diamond layer is deposited on the substrate.

In some embodiments of the invention, the metal layer is produced on the substrate prior to the deposition of the epitaxial diamond layer, e.g. by magnetron sputtering or thermal evaporation of at least one metal. After the deposition of the metal layer, an optional cleaning step can be provided, e.g. to remove oxide layers or other contaminations from the metal layer. The cleaning step can be selected from cleaning with a liquid solvent and/or thermal desorption and/or reactive ion sputtering.

The diamond layer according to the invention is deposited on the metal layer, as already described above. According to the invention, it has been detected that the lattice mismatch and, resulting therefrom, the density of defects, such as dislocations, can be reduced when an intermediate layer having greater lattice constants than diamond and reduced hardness is produced between the metal layer and the diamond layer. The hardness of a thin metal layer can be determined from phonon energies for the purposes of the present invention. Within the meaning of the present description a soft layer or a layer having a reduced hardness designates a material which has reduced phonon energies. This means that the maximum of the distribution function in the Raman spectrum is at lower wave numbers.

In some embodiments of the invention, the intermediate layer can have a thickness of about 0.5 µm up to about 10 µm. In other embodiments of the invention, the intermediate layer can have a thickness of about 2 µm to about 5 µm.

Completely by surprise, it has been detected that, in spite of the remaining lattice mismatch, such an intermediate layer is suitable to absorb the mechanical stresses when the diamond layer grows, as a result of which the formation of grain boundaries and dislocations is significantly reduced and a diamond layer having improved crystal quality can be produced.

In some embodiments of the invention, such a diamond layer can be used as a starting substrate for producing electronic components. In other embodiments of the invention, the diamond layer produced according to the invention can be used as a window having improved optical properties. For example, the absorption and/or the scattering of penetrating light can be reduced.

In some embodiments of the invention, the substrate can contain, or consist of, diamond and/or silicon and/or magnesium oxide and/or strontium titanate. In some embodiments of the invention, the substrate can contain, or consist of, a metal oxide. Here, silicon has the advantage that the substrate material is also readily available for a large area. The use of diamond as a substrate material avoids the occurrence of mechanical stresses in the deposited diamond layer since the thermal coefficient of expansion of the substrate and the deposited diamond layer is almost identical.

In some embodiments of the invention, the fourth, fifth or sixth period metal can be selected from platinum and/or iridium and/or rhenium and/or molybdenum. These metals have a sufficiently small lattice mismatch in relation to the resulting diamond layer and have a sufficiently high melting point. Therefore, the metal layer remains stable when the diamond is deposited from the gas phase.

In some embodiments of the invention, the intermediate layer can contain, or consist of, diamond which is doped at least with boron. The lattice constant of the diamond changes by doping it with boron, and therefore an intermediate layer produced in such a way has a higher lattice constant than undoped crystalline diamond. Due to the doping of the diamond, the hardness thereof is simultaneously reduced and/or the intermediate layer has reduced phonon energies. Therefore, an intermediate layer produced in such a way it suitable to reduce mechanical stresses which result from the lattice mismatch in relation to the metal layer, and therefore the diamond layer can be deposited with improved crystal quality.

In some embodiments of the invention, the number of boron atoms in the intermediate layer can be between about $2 \cdot 10^{21}$ cm$^{-3}$ and about $5 \cdot 10^{22}$ cm$^{-3}$. In other embodiments of the invention, the number of boron atoms in the intermediate layer can be between about $5 \cdot 10^{21}$ cm$^{-3}$ and about $1 \cdot 10^{22}$ cm$^{-3}$ or between about $5 \cdot 10^{21}$ cm$^{-3}$ and about $9 \cdot 10^{21}$ cm$^{-3}$. This doping is sufficient to effect the desired change in the lattice constant and the phonon energies, on the one hand, and not to change substantially the binding conditions of the diamond layer, on the other hand.

In some embodiments of the invention, the lattice constant of the intermediate layer is higher by an amount $\delta a$ than the lattice constant of the undoped diamond layer, wherein the ratio $\delta a/a$ is selected between about $5 \cdot 10^{4}$ and about $4 \cdot 10^{-3}$ or between about $1 \cdot 10^{-3}$ and about $3 \cdot 10^{-3}$. The use of a diamond layer as an intermediate layer here has the advantage that the intermediate layer and the diamond layer can be deposited in a single coating method successively so as to avoid contamination of the surface of the intermediate layer and to avoid elaborate handling between the production of the intermediate layer and the epitaxial diamond layer.

In some embodiments of the invention, the number of boron atoms having the thickness of the intermediate layer can be reduced. In some embodiments of the invention, the intermediate layer can change in graded fashion into the epitaxial diamond layer. Such a graded transition avoids the occurrence of voltage peaks on the boundary layer between the intermediate layer and the epitaxial diamond layer, and therefore the adhesive strength can be increased and/or the defect density can be further reduced.

The invention shall be explained in more detail below by means of figures without limiting the general inventive concept, wherein FIG. 1 shows a cross-section through a diamond layer according to the invention on a substrate.

Figure 2:
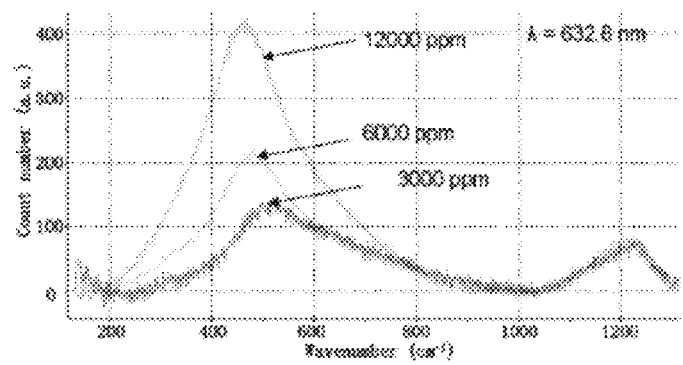
FIG. 2 shows Raman spectra of different intermediate layers.

FIG. 2 shows Raman spectra of different intermediate layers.

Figure 3:
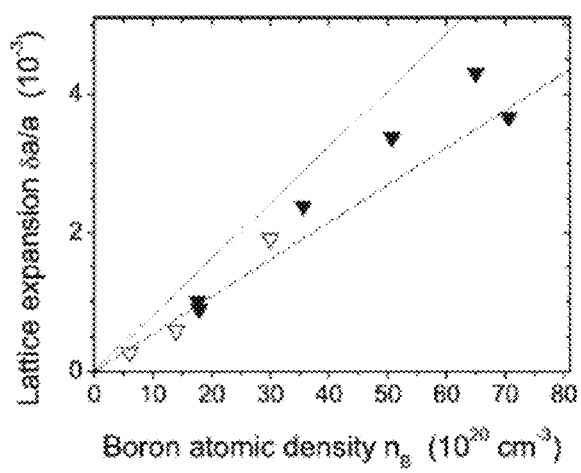
FIG. 3 shows the change in the lattice constant depending on the boron doping.

FIG. 3 shows the change in the lattice constant depending on the boron doping.

Figure 4:
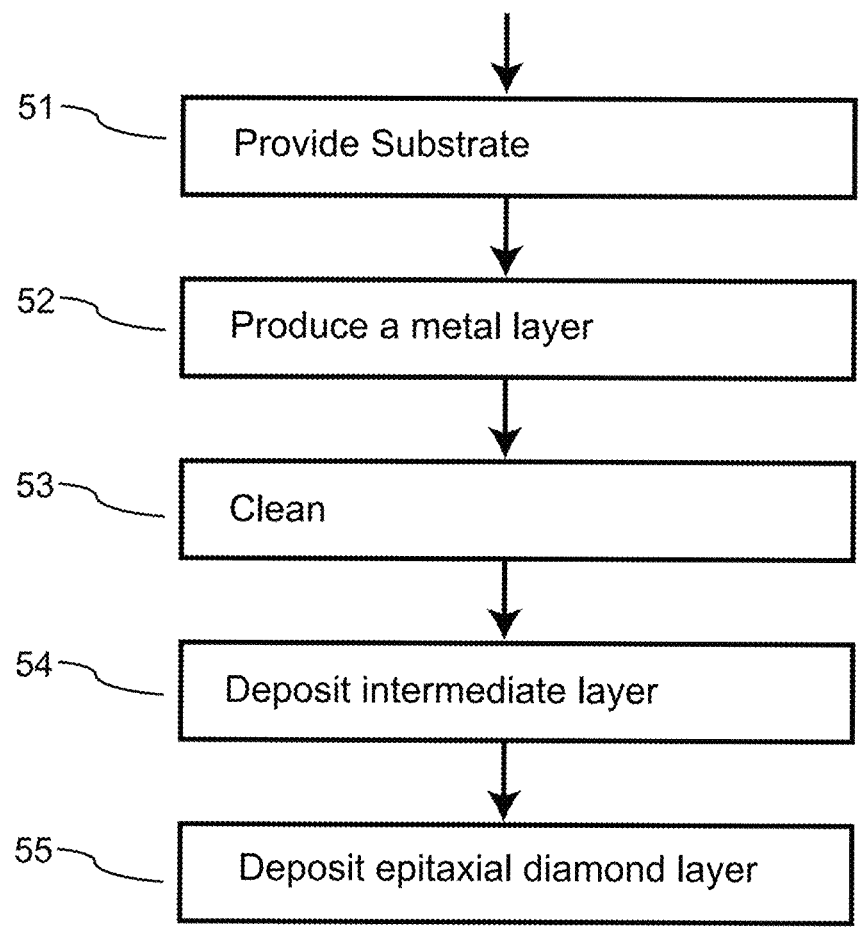
FIG. 4 shows a flow diagram of the method according to the invention.

FIG. 4 shows a flow diagram of the method according to the invention.

FIG. 1 shows a layer system according to the invention, having an epitaxial diamond layer 1, an intermediate layer 2 according to the invention, a metal layer 3 and a substrate 4. In some embodiments of the invention, the substrate 4 can contain a metal oxide, silicon or diamond. In some embodiments of the invention, the substrate 4 can contain, or consist of, magnesium oxide and/or strontium titanate. The substrate can have a thickness of 100 μm to about 1000 μm or of about 200 μm to about 500 μm. The substrate can have a diameter of about 2.5 cm, about 5 cm, about 10 cm or about 30 cm. As a result, it is also possible to produce large areas of epitaxial diamond layers on the substrate.

A metal layer 3, which contains, or consists of, at least one fourth, fifth or sixth period metal having a melting point of more than 1200 K, is disposed on the substrate 4. For example, the metal layer can contain iridium.

Iridium can be produced as a pure elemental phase on the substrate 4, e.g. by sputter coating from a metal target. In some embodiments of the invention, the metal layer can have a thickness of about 1 μm to about 30 μm or about 3 μm to about 10 μm.

The intermediate layer 2 according to the invention, which has a higher lattice constant and a lower hardness than the material of the epitaxial diamond layer 1 is disposed on the metal layer 3. A lower hardness within the meaning of the present invention refers to lower phonon energies which can be determined by Raman scattering, for example.

In some embodiments of the invention, the intermediate layer 2 can contain, or consist of, a diamond layer which is deposited heteroepitaxially on the metal layer 3, said diamond layer containing a dopant. In some embodiments of the invention, the dopant can be boron having a concentration of about $1 \cdot 10^{20}$ cm$^{-3}$ to about $8 \cdot 10^{21}$ cm$^{-3}$. The concentration of the dopant can drop in the pattern of the intermediate layer 2, i.e. starting from the surface of the metal layer 3 to the transition to the epitaxial diamond layer 1, and therefore the density of the dopant is at a maximum on the surface of the metal layer 3 and is at a minimum on the side of the intermediate layer 2, facing the epitaxial diamond layer 1.

In some embodiments of the invention, the intermediate layer 2 can be about 1 μm to about 10 μm.

The epitaxial diamond layer 1 is produced on the intermediate layer. Like the intermediate layer 2, the diamond layer 1 can be deposited from an activated gas phase, e.g. according to a PECVD method. To this end, the activated gas phase can contain hydrogen as a carrier gas, which is admixed with between about 1% and about 5% of a hydrocarbon. The epitaxial diamond layer can have a thickness of about 10 μm to about 500 μm or a thickness of about 50 μm to about 200 μm. It is one of the advantages of the invention that the intermediate layer 2 reduces the lattice mismatch in relation to the metal layer 3, as a result of which thin diamond layers 1 having low defect density are also grown and thus have a high crystal quality which is required e.g. for substrates to produce electronic components.

FIG. 2 shows Raman spectra of intermediate layers 2 having different composition. The intermediate layer contains in each case diamond which was produced heteroepitaxially from the gas phase on the metal layer 3. Spectra for three different concentrations of boron are shown which was used as a dopant in the illustrated exemplary embodiment.

Here, the first curve shows measurement values for a boron content of 3000 ppm, the middle measurement curve shows data for a boron content of 6000 ppm and the third measurement curve shows measurement data for a boron content of 12000 ppm. As shown in FIG. 2, the maximum in the Raman spectrum is shifted to smaller wave numbers. This is an indicator of the fact that the phonon energy is reduced when the boron content increases. For the purposes of the present invention, a diamond layer having higher boron content is therefore considered to be a layer having reduced hardness.

FIG. 3 shows the change in the lattice constant of an intermediate layer 2 deposited heteroepitaxially on the metal layer 3 depending on the boron content. The boron content between $5 \cdot 10^{20}$ cm$^{-3}$ and $7 \cdot 10^{21}$ cm$^{-3}$ is shown on the abscissa. The ordinate illustrates the numerical value for the ratio between the change in the lattice constant and the lattice constant of undoped material $\delta a/a$.

As shown in FIG. 3, the lattice constant changes between about $5 \cdot 10^{-4}$ and about $4 \cdot 10^{-3}$ when the boron content of the intermediate layer increases. Therefore, a boron-doped diamond layer can be used as an intermediate layer according to the invention, which has a higher lattice constant than crystalline diamond and a reduced hardness.

FIG. 4 shows a flow diagram of a method according to the invention. In the first method step 51, a substrate is provided, e.g. from silicon or diamond or a metal oxide. The substrate can be a monocrystalline substrate which has a predeterminable crystal orientation. The thermal coefficient of expansion of the substrate can be selected in such a way that there are only minor differences with respect to the thermal expansion of the epitaxial diamond layer to be produced.

In a second method step 52, a metal layer is produced on at least a subarea of the substrate. For example, the metal layer can contain, or consist of, platinum, iridium, rhenium or molybdenum. The metal layer can be produced e.g. by sputter coating in a vacuum. In other embodiments of the invention, the metal layer can be produced by other, generally known methods, e.g. by electroplating.

An optional cleaning step 53 can be carried out subsequently to the deposition of the metal layer. The cleaning step 53 can include e.g. wet chemical cleaning by means of a solvent. The solvent can be selected from water, an alcohol and/or an organic solvent, for example. Alternatively or additionally, the surface of the metal layer can be cleaned by thermal desorption or reactive ion sputtering.

The intermediate layer according to the invention is deposited in method step 54 and has a greater lattice constant and a lower hardness than the epitaxial diamond layer to be produced. In some embodiments of the invention, a doped diamond layer can be used as the intermediate layer. For example, the diamond layer can be doped with boron. Like the epitaxial diamond layer, the intermediate layer 54 can also be deposited from an activated gas phase.

In the last method step 55, the epitaxial diamond layer can be deposited in known manner from an activated gas phase. If the doped diamond layer is also used as an intermediate layer, the deposition of the intermediate layer and the epitaxial diamond layer can be carried out in a single operational step, wherein the supply of the dopant is reduced either abruptly or gradually at the transition between the method steps 54 and 55 to produce a nominally undoped epitaxial diamond layer on the doped intermediate layer.

Of course, it is not excluded that the nominally undoped epitaxial diamond layer also contains unavoidable contaminations, e.g. also low boron doping which is caused by the preceding method step.

In an optional method step which is not explained in more detail, the substrate and/or the metal layer can subsequently be removed. This can be made by mechanical processing, wet chemical etching or dry chemical etching so as to expose the epitaxial diamond layer 1. If only the metal layer 3 is removed, the substrate 4 can be reused to produce further epitaxial diamond layers.

Of course, the invention is not limited to the embodiments illustrated in the drawings. Therefore, the above description should not be considered limiting but explanatory. The below claims should be comprehended in such a way that a feature mentioned is present in at least one embodiment of the invention. This does not rule out the presence of further features. In so far as "first" and "second" features are indicated, this designation serves for distinguishing two similar features without determining an order.

We claim:

1. A method for producing epitaxial diamond layers, comprising the following steps:
   providing a substrate;
   depositing a metal layer on at least a subarea of the substrate, wherein the metal layer comprises at least one period 4, 5 or 6 metal having a melting point of greater than or equal to 1200 K; and
   depositing a diamond layer on at least a subarea of the metal layer, wherein at least one intermediate layer is deposited on the metal layer and the diamond layer, wherein the at least one intermediate layer has a higher lattice constant than undoped crystalline diamond and a lower hardness than undoped crystalline diamond, and the at least one intermediate layer comprises a diamond doped at least with boron.

2. The method according to claim 1, wherein the substrate comprises at least one of diamond, silicon, MgO$_2$, or SrTiO$_3$.

3. The method according to claim 1, wherein the period 4, 5 or 6 metal is selected from at least one of platinum, iridium, rhenium, or molybdenum.

4. The method according to claim 1, wherein between about $2 \cdot 10^{21}$ cm$^{-3}$ and about $5 \cdot 10^{22}$ cm$^{-3}$ or between about $5 \cdot 10^{21}$ cm$^{-3}$ and about $1 \cdot 10^{22}$ cm$^{-3}$ or between about $5 \cdot 10^{21}$ cm$^{-3}$ and about $9 \cdot 10^{21}$ cm$^{-3}$ boron atoms are introduced into the intermediate layer.

5. The method according to claim 1, wherein the number of boron atoms decreases with the thickness of the intermediate layer or that the intermediate layer changes in graded fashion into the diamond layer.

6. The method according to claim 1, wherein the lattice constant of the intermediate layer is higher by an amount $\delta a$ than the lattice constant of the diamond layer, wherein the ratio $\delta a/a$ is selected between about $5 \cdot 10^{-4}$ and about $4 \cdot 10^{-3}$ or between about $1 \cdot 10^{-3}$ and about $3 \cdot 10^{-3}$.

7. An epitaxial layer comprising:
   a diamond layer on a substrate, wherein a metal layer is present at least on a subarea of the substrate and the metal layer comprises at least one period 4, 5 or 6 metal having a melting point of greater than or equal to 1200 K, and
   at least one intermediate layer is arranged between the metal layer and the diamond layer, said intermediate layer having a higher lattice constant than undoped crystalline diamond and a lower hardness than undoped crystalline diamond, and the intermediate layer comprises diamond doped at least with boron.

8. The epitaxial layer according to claim 7, wherein the period 4, 5 or 6 metal is selected from at least one of platinum, iridium, rhenium, or molybdenum.

9. The epitaxial diamond layer according to claim 7, wherein the substrate comprises at least one of diamond, silicon, $MgO_2$, or $SrTiO_3$.

10. The epitaxial layer according to claim 7, wherein the number of boron atoms in the intermediate layer is between about $2 \cdot 10^{21}$ cm$^{-3}$ and about $5 \cdot 10^{22}$ cm$^{-3}$ or between about $5 \cdot 10^{21}$ cm$^{-3}$ and about $1 \cdot 10^{22}$ cm$^{-3}$ or between about $5 \cdot 10^{21}$ cm$^{-3}$ and about $9 \cdot 10^{21}$ cm$^{-3}$.

11. The epitaxial layer according to claim 7, wherein the number of boron atoms decreases with the thickness of the intermediate layer or that the intermediate layer changes in graded fashion into the diamond layer.

12. The epitaxial layer according to claim 11, wherein the lattice constant of the intermediate layer is higher by an amount $\delta a/a$ than the lattice constant of the diamond layer, wherein the ratio $\delta a/a$ is selected between about $5 \cdot 10^{-4}$ and about $4 \cdot 10^{-3}$ or between about $1 \cdot 10^{-3}$ and about $3 \cdot 10^{-3}$.

* * * * *